United States Patent
Whinnery

(10) Patent No.: US 7,629,727 B2
(45) Date of Patent: Dec. 8, 2009

(54) SCALABLE TUBULAR MECHANICAL ENERGY HARVESTING DEVICE

(75) Inventor: Joseph Whinnery, Marysville, OH (US)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 11/960,788

(22) Filed: Dec. 20, 2007

(65) Prior Publication Data

US 2009/0160292 A1 Jun. 25, 2009

(51) Int. Cl.
*H01L 41/08* (2006.01)

(52) U.S. Cl. ........................ 310/319; 310/339

(58) Field of Classification Search .................. 310/369, 310/365, 339, 317, 318, 319; 320/107; H01L 41/08
See application file for complete search history.

(56) References Cited

U.S. PATENT DOCUMENTS

| | | | |
|---|---|---|---|
| 3,798,474 A | 3/1974 | Cassand et al. | |
| 5,275,885 A | 1/1994 | Ogura | |
| 5,432,498 A | 7/1995 | Zilbershtein et al. | |
| 6,169,479 B1 | 1/2001 | Boran et al. | |
| 6,593,681 B2 | 7/2003 | Ebisawa et al. | |
| 6,807,853 B2 * | 10/2004 | Adamson et al. | 73/146 |
| 6,992,423 B2 | 1/2006 | Mancosu et al. | |
| 7,019,241 B2 | 3/2006 | Grassl et al. | |
| 7,047,800 B2 | 5/2006 | Thiesen et al. | |
| 7,138,750 B2 | 11/2006 | Mancosu et al. | |
| 2007/0120667 A1 | 5/2007 | Mainini et al. | |
| 2007/0205893 A1 | 9/2007 | Mainini et al. | |
| 2007/0257634 A1 * | 11/2007 | Leschin et al. | 320/107 |
| 2009/0127976 A1 * | 5/2009 | Ward et al. | 310/319 |

OTHER PUBLICATIONS

A Batteryless Remote Control For Volvo, results of a feasibility study; A.J. Jansen, Delft University of Technology, The Netherlands, S. Fridstedt and A.J.W. Weernink, Sep. 2000.

* cited by examiner

*Primary Examiner*—Walter Benson
*Assistant Examiner*—Karen B Addison
(74) *Attorney, Agent, or Firm*—Mark E. Duell, Esq.; Emerson, Thomson & Bennett

(57) ABSTRACT

The present invention generally relates to devices and methods for converting mechanical energy into electrical energy to power electronic devices. Some embodiments include one or more piezoelectric fibers disposed on a flexible central body capable of elastically deforming under an applied force. The piezoelectric fibers can be in electrical communication with one or more electrodes adapted to harvest electrical energy from the piezoelectric fiber and provide such energy to an external circuit. Some embodiments can also include one or more diodes interposed between the electrode and the external circuit.

20 Claims, 3 Drawing Sheets

SCALABLE TUBULAR MECHANICAL ENERGY HARVESTING DEVICE

I. BACKGROUND OF THE INVENTION

A. Field of Invention

This invention generally relates to devices and methods for converting mechanical energy into electrical energy. Some embodiments relate to piezoelectric devices.

B. Description of the Related Art

Devices for converting mechanical energy into electrical energy are well known in the art, e.g. antique hand-crank telephones. In the mid twentieth century vibrational energy harvesting devices (i.e. piezoelectric devices) were shown to be useful energy transducers. In one well known design a piezoelectric ceramic material is bonded to a cantilever beam to generate a voltage when the beam is deflected. Similar vibrating beam generators have been used to power sensors and wireless transmitters, replacing batteries in some cases. Existing devices can be less than optimum due to inefficient coupling between the mechanical vibrational energy input and the resonant frequencies of the piezoelectric element. Therefore there is a need in the art for a piezoelectric device that is capable of more efficiently harvesting mechanical energy from a wider range of vibrational modes.

II. SUMMARY OF THE INVENTION

Some embodiments of the present invention relate to a device, comprising: a central cylinder having a first end and a second end spaced apart from the first end and defining a longitudinal axis, the central cylinder being adapted to support one or more piezoelectric elements; at least one piezoelectric fiber wound around the central cylinder according to a helical pattern; at least one positive electrode in electrical communication with the at least one piezoelectric fiber, and adapted to impose a positive electric field on the piezoelectric fiber, the applied electric field causing a structural change in the at least one piezoelectric fiber; at least one positive terminal strip in electrical communication with the at least one positive electrode; at least one output diode electrically separating the at least one positive electrode from the at least one positive terminal strip, and permitting a current to flow from the positive electrode to the positive terminal strip; at least one input diode electrically separating the at least one positive electrode from the at least one positive terminal strip, and permitting a current to flow from the terminal strip to the positive electrode; at least one negative electrode in electrical communication with the at least one piezoelectric fiber, and adapted to impose a negative electric field on the piezoelectric fiber, the applied electric field causing a structural change in the at least one piezoelectric fiber; at least one negative terminal strip in electrical communication with the at least one negative electrode; at least one output diode electrically separating the at least one negative electrode from the at least one negative terminal strip, and permitting a current to flow from the negative electrode to the negative terminal strip; at least one input diode electrically separating the at least one negative electrode from the at least one negative terminal strip, and permitting a current to flow from the terminal strip to the negative electrode; and a nonconductive layer disposed over the at least one piezoelectric fiber and the electrodes, the nonconductive layer electrically isolating the underlying elements from the surrounding environment.

Other embodiments relate to a means for supplying power to a remote keyless entry device, comprising: a piezoelectric transducing means; at least two oppositely chargeable means for collecting electrical energy from the piezoelectric transducing means; at least two oppositely chargeable current collecting means for receiving current from one or more conductive means having the same charge; at least two oppositely directed rectifying means for rectifying current from the positively chargeable means to the positive current collecting means, the positive current collecting means being capable of electrically communicating with an external circuit; and at least two oppositely directed rectifying means for rectifying current from the negatively chargeable means to the negative current collecting means, the negative current collecting means being capable of electrically communicating with an external circuit.

Other benefits and advantages will become apparent to those skilled in the art to which it pertains upon reading and understanding of the following detailed specification.

III. BRIEF DESCRIPTION OF THE DRAWINGS

The invention may take physical form in certain parts and arrangement of parts, embodiments of which will be described in detail in this specification and illustrated in the accompanying drawings which form a part hereof and wherein.

IV. DETAILED DESCRIPTION OF THE INVENTION

Figure 1:
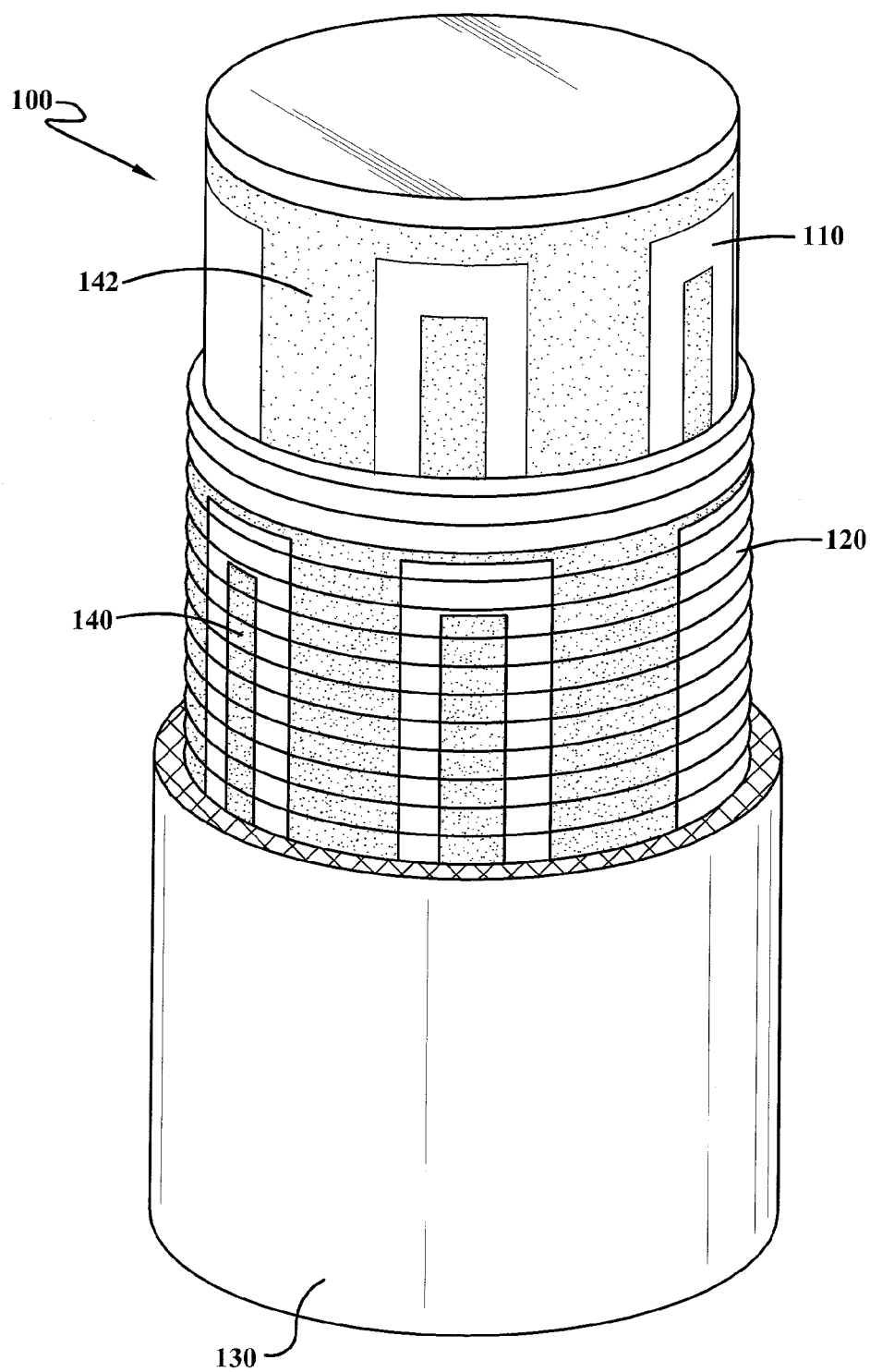
FIG. 1 shows a perspective view drawing of an embodiment of the invention.

The present invention generally relates to piezoelectric devices, and related methods. Some embodiments relate to a piezoelectric device for powering one or more electronic components.

One embodiment comprises a flexible central body. The central body supports one or more piezoelectric fibers disposed on a surface of the central body. According to such embodiments, a force is applied to the central body causing the one or more piezoelectric fibers to deform, thereby generating an electrical potential. The electrical potential can be harnessed to perform useful work, such as powering one or more electrical components. In some embodiments, the electrodes of the piezoelectric device are configured to harvest mechanical energy from a wide range of vibrational modes and convert such mechanical energy to electrical energy.

According to some embodiments, the central body can comprise a flexible cylinder. For example some central bodies can comprise a hollow cylinder comprised of an elastically deformable material. In some embodiments, such a cylinder can support one or more piezoelectric fibers, such as by winding the one or more fibers around the cylinder in a helical pattern. Some embodiments also include one or more pairs of electrodes for harvesting electrical energy from the one or more piezoelectric fibers. For instance, some embodiments can include positive and negative electrodes in electrical communication with the one or more piezoelectric fibers. Such electrodes can be disposed over, under, or both over and under the one or more piezoelectric fibers. Some embodiments can comprise a plurality of positive and negative electrodes. Therefore such embodiments can also include one or more terminal strips, for example, in the form of a full bridge rectifier. Terminal strips can be in electrical communication with the plurality of positive or negative electrodes. According to such embodiments, the terminal strips function as electrical manifolds collecting electrical energy from the plurality of positive or negative electrodes. Thus, a single lead can be attached to the positive terminal strip to collect electrical energy from all of the positive electrodes at once, and a single negative lead can be similarly used to collect energy from all of the negative electrodes.

According to some embodiments the flexible central body has a first end and a second end spaced apart from the first end and defining a longitudinal axis. According to some embodiments, the central body can be hollow, and in other embodiments the central body can be solid. Appropriate cross sectional shapes of central bodies can include, without limitation, a circle, ellipse, polygon, parallelogram, rectangle, square, and the like or any combination thereof. Some embodiments include hollow or solid cylinders having such cross sectional shapes. In some embodiments the central body can have a right circular cylindrical shape. In some embodiments the central body is capable of non-uniformly elastically deforming under a force so as to produce non-uniform strain, wherein some regions have a high degree of strain relative to other stained regions. One of skill in the art will recognize that any of a wide variety of geometries is within the scope of the present invention. In some embodiments the central body comprises one or more flexible materials such as, without limitation, spring steel, elastomer, nonelastomeric rigid polymer, polymer foams, and the like or any combination thereof.

Central bodies can also comprise a wide range of lengths including lengths from about 0.1 mm to about 10,000 mm. Other lengths can include lengths from about 0.1 mm to about 1 mm, from about 1 mm to about 10 mm, from about 10 mm to about 100 mm, from about 100 mm to about 1000 mm, and even from about 1000 mm to about 10,000 mm.

The piezoelectric fiber can comprise any of a wide variety of commercially available piezoelectric fibers. Some embodiments include sintered piezoelectric fibers. Furthermore, some embodiments include a single sintered piezoelectric fiber. Some embodiments include piezoelectric fibers fabricated according to a viscous suspension spinning process, a viscous plastic processing method, sol gel extrusion methods, or various other methods known in the art. Furthermore, one of skill in the art will recognize that various materials can be used to fabricate piezoelectric fibers of the present invention, including without limitation, polyvinylidene fluoride, lithium niobiate, barium titanate, barium strontium titanate, lead scandium titanate, and/or lead zirconate titanate, which is known according to the chemical formula $Pb[Zr_xTi_{1-x}]O_3$ (where $0<x<1$). Piezoelectric compositions comprising these or other materials can also include a wide variety of dopants. One of skill in the art can readily select piezoelectric materials having appropriate dopants, and dopant concentrations. Some dopants include oxygen, lanthanum, phosphorus, lithium and/or other known dopants.

Piezoelectric fibers can be applied to the central body according to a variety of patterns, including, without limitation, applying a helically wound layer to an outer surface of the central body, to an inner surface of the central body, a plurality of helically wound layers to an outer surface of the central body, or any combination thereof. Embodiments having a plurality of layers of piezoelectric fibers can also include electrodes interposed between the layers. In other embodiments, the central body can support a plurality of piezoelectric fibers.

In some embodiments, the piezoelectric fiber or fibers can be bonded to the central body, for instance, with a bonding agent. Some bonding agents include, without limitation, epoxy resins, cyanoacrylate resins, acrylic resins, and any combination thereof. In some embodiments, the resin is coated on the central body, and the fiber is wound around the central body while the resin is not completely cured. Thus, when the resin cures the fiber is embedded in the resin. Suitable resins are capable of flexing under typical operating conditions of the piezoelectric device. For example, if the device is to be compressed by 10% according to normal operation then the resin would be capable of flexing accordingly to accommodate the compression without fracturing. One of skill in the art will recognize that a wide variety of resins are appropriate, and thus the present invention is not limited to those materials specifically set forth here.

One of skill in the art will recognize that electrodes can be fabricated according to a wide variety of methods and from a wide variety of materials. For example, electrodes can comprise conductive materials such as aluminum, silver, gold, platinum, copper or any combination thereof. In some embodiments, electrodes can comprise structures such as wire, ribbon, foil, filament, interdigitated patterns or any combination thereof. Some embodiment can comprise fine gauge wire, such as 32 gauge copper wire. Furthermore, in some embodiments, electrodes can be deposited on the piezoelectric fiber, or on a surface in contact with the fiber. For instance, in some embodiments, the electrode can be deposited by painting, lithography, sputtering, or any combination thereof. According to some embodiments, the positive and negative electrodes can be independently selected from any combination of materials and/or structures set forth herein.

In some embodiments, electrodes can comprise a fine gauge wire, which is wrapped round the piezoelectric fiber. For instance, the fine gauge wire can comprise a 32 gauge copper wire wrapped in a tightly wound helical pattern on the piezoelectric fiber. According to such embodiments, the longitudinal axis of the electrode helix coincides with the longitudinal axis of a straight, fully extended, piezoelectric fiber. The combination of the piezoelectric fiber wrapped in an electrode can then be wrapped helically around the central body. Accordingly, the contact surface of the electrode to the fiber can be substantially enhanced over other patterns, thereby increasing the efficiency of energy harvesting from the piezoelectric fiber.

In embodiments having interdigitated electrodes, the digits of such electrodes can have any of a wide variety of spacings. For example, some spacings within the scope of the present invention include, without limitation, from about 50 micrometers to about 3000 micrometers. Some embodiments include spacings from about 50 micrometers to about 100 micrometers, from about 100 to about 200 micrometers, from about 200 to about 300 micrometers, from about 300 to about 400 micrometers, from about 400 to about 500 micrometers, from about 500 to about 600 micrometers, from about 600 to about 700 micrometers, from about 700 to about 800 micrometers, from about 800 to about 900 micrometers, from about 900 to about 1000 micrometers, from about 1000 to about 1100 micrometers, from about 1100 to about 1200 micrometers, from about 1200 to about 1300 micrometers, from about 1300 to about 1400 micrometers, from about 1400 to about 1500 micrometers, from about 1500 to about 1600 micrometers, from about 1600 to about 1700 micrometers, from about 1700 to about 1800 micrometers, from about 1800 to about 1900 micrometers, from about 1900 to about 2000 micrometers, from about 2000 to about 2100 micrometers, from about 2100 to about 2200 micrometers, from about 2200 to about 2300 micrometers, from about 2300 to about 2400 micrometers, from about 2400 to about 2500 micrometers, from about 2500 to about 2600 micrometers, from about 2600 to about 2700 micrometers, from about 2700 to about 2800 micrometers, from about 2800 to about 2900 micrometers, or even from about 2900 to about 3000 micrometers. Here, as elsewhere in the specification and claims, ranges may be combined.

According to some embodiments, the electrodes are arranged in an alternating positive/negative pattern. Furthermore, the pattern may repeat in a direction parallel to the longitudinal axis of the central body.

In some embodiments having interdigitated electrodes, the spacing between adjacent pairs of digits may vary according to any appropriate pattern. For example, some regions over the surface of a central body may benefit from having more digits per inch. Thus, the spacing in such regions may be smaller than in other regions. Furthermore, the digits themselves may be smaller, further enabling a higher number of digits per inch.

According to some embodiments, one or more diodes can be interposed between an electrode and a terminal strip. For instance, in some embodiments an electrode can be in indirect electrical communication with a terminal strip through a diode at a first point and a second point. A diode can be interposed between the electrode and the terminal strip at the first point such that electrical current can flow from the electrode to the terminal strip. At the second point, a second diode can be interposed so that current can only flow from the terminal strip to the electrode. Thus, current can flow in either direction, but must flow through one diode to flow in one direction, and the other diode to flow in the other direction. In some embodiments, electrodes are grouped together into sets. For instance, one set may consist of four electrodes all in direct electrical communication with each other. The set may be in indirect electrical communication with a terminal strip through a first diode and a second diode allowing current to flow in opposite directions. Furthermore, some embodiments comprise a plurality of sets of electrodes each set being similarly connected to a terminal strip.

According to some embodiments, mechanical energy can be converted into electrical energy by devices of the present invention by applying a compression force in a radial direction relative to the central body, causing the central body to adopt a compressed conformation. Furthermore, additional mechanical to electrical energy conversion can take place when the central body relaxes and returns to its initial conformation. Therefore, the electric field produced under compression has an opposite sign relative the field produced during relaxation. Accordingly, some embodiments couple one or more electrodes to an external circuit through a pair of parallel diodes having opposite polarities.

Figure 3:
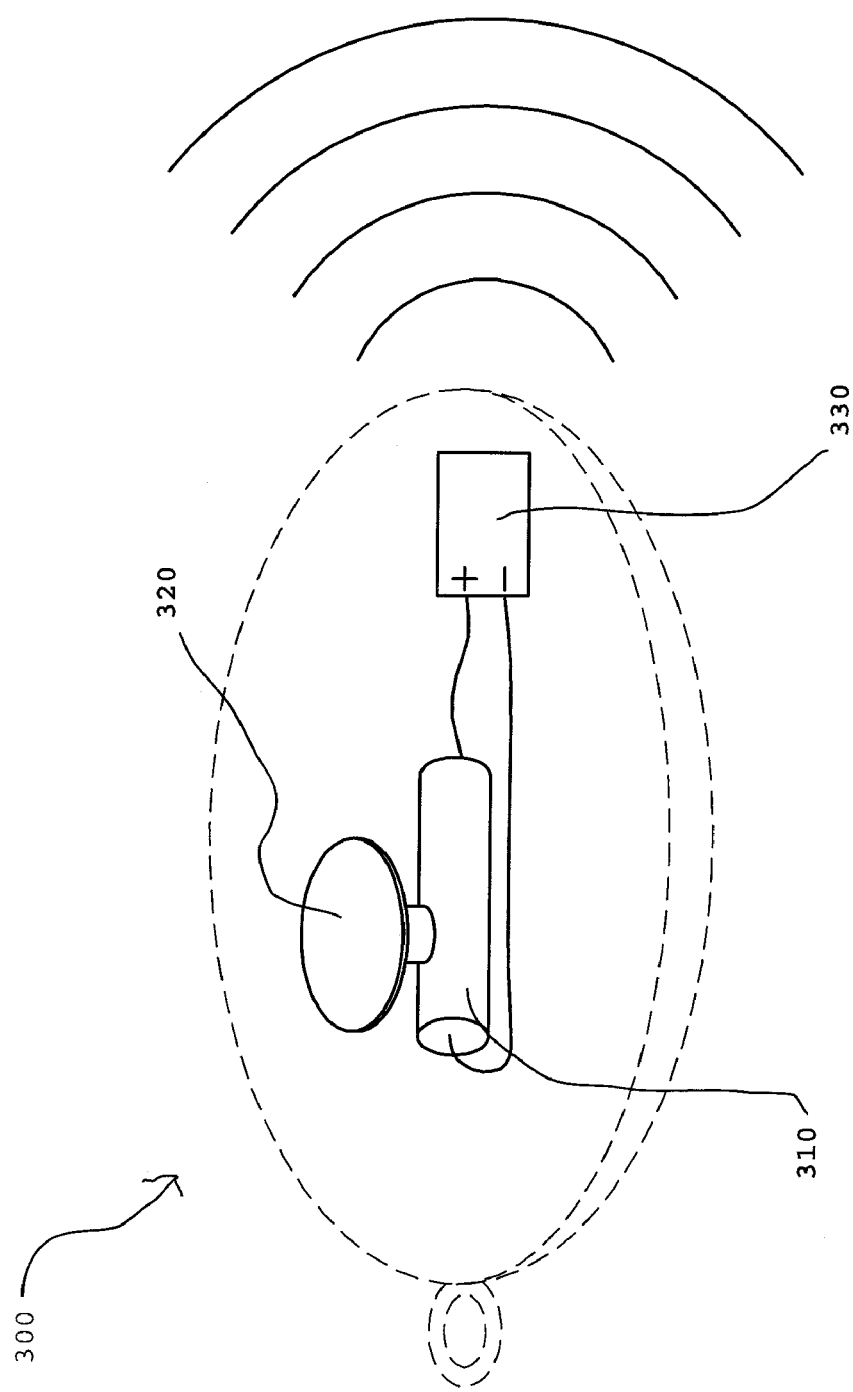
FIG. 3 shows a schematic of a remote keyless entry device, according to one embodiment.

In some embodiments the terminal strips can be in electrical communication with an external circuit. For example, in FIG. 3 one embodiment comprises a remote keyless entry device 300. In such a device, the piezoelectric device 310 can be positioned in mechanical contact with a button 320, or similar device so that depressing the button 300 imparts a radial force to the piezoelectric device 310 resulting in an elastic deformation. Such deformation causes an electrical potential to develop in the piezoelectric device 310, which can be harvested and directed to an external circuit to power components such as a radio transmitter 330.

Some embodiments include an encapsulating layer having a high dielectric constant. The encapsulating layer may cover the piezoelectric fiber, and the electrodes and/or terminal strips. The function of the encapsulating layer can include electrically insulating the electrodes from one another so as to prevent arcing. In some embodiments, the bonding agent set forth above can also function as the encapsulating layer. Any of a wide variety of high-dielectric polymer resins can comprise the encapsulating layer including, without limitation, epoxy resins, cyanoacrylate resins, acrylic resins and any combination thereof.

Referring now to the drawings wherein the showings are for purposes of illustrating embodiments of the invention only and not for purposes of limiting the same, FIG. 1 is a drawing of an embodiment 100 comprising a central body 110 having a right circular cylindrical shape. According to this embodiment, a single piezoelectric fiber 120 is wrapped helically around an outer surface of the central body. A first pair of positive/negative interdigitated electrodes 140 is disposed on the surface of the piezoelectric fiber winding. A second pair of interdigitated electrodes 142 is disposed between the central body 110 and the winding 120. The embodiment 100 is encapsulated by a nonconductive layer 130 and thereby insulated from the surrounding environment.

Figure 2:
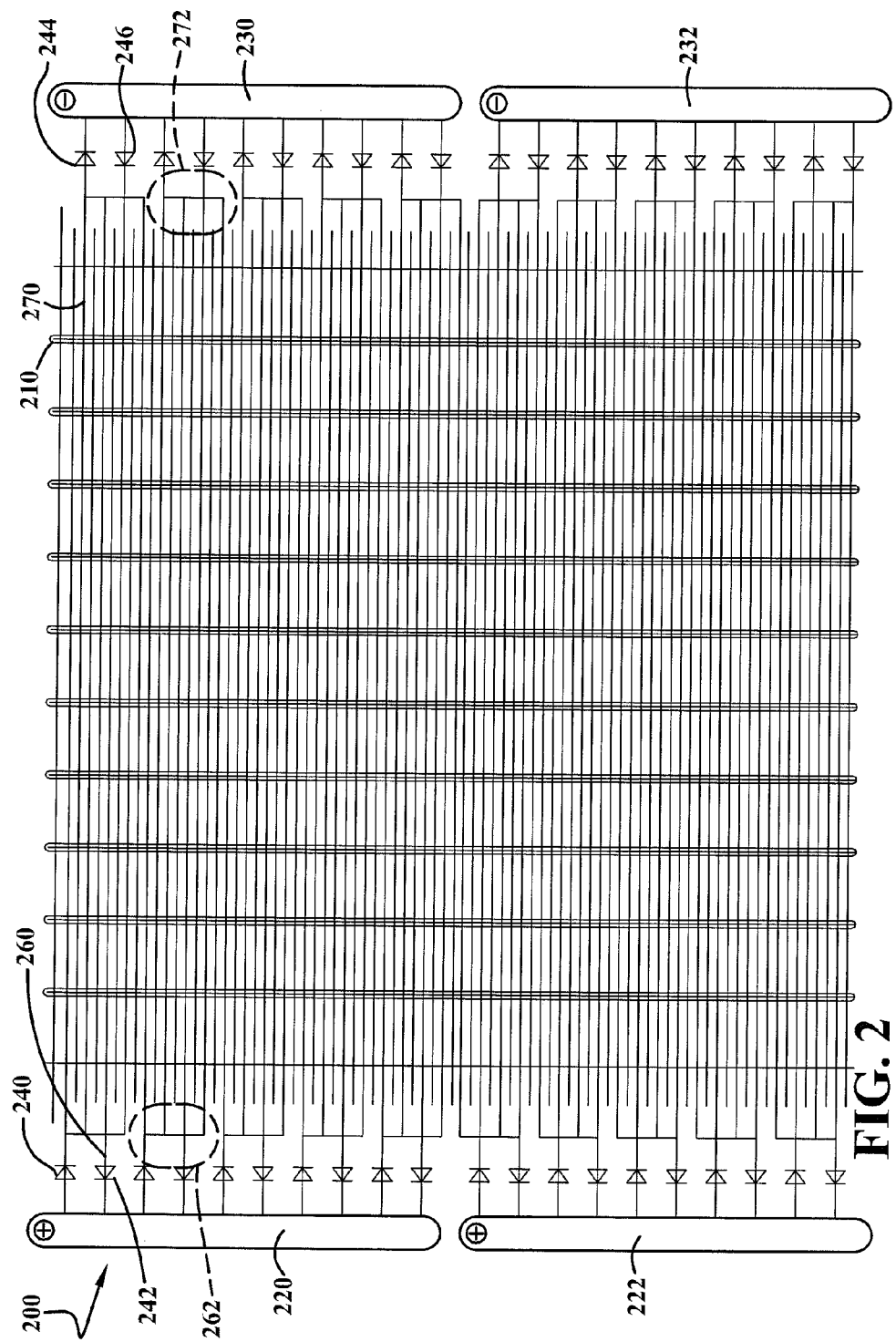
FIG. 2 shows a plan view of an electrical schematic showing the electrical connectivity of an embodiment.

FIG. 2 is a schematic drawing showing the electrical connectivity of one embodiment. According to this embodiment 200, a plurality of piezoelectric fibers 210 are shown running vertically and are overlaid with positive interdigitated electrodes 260 and negative interdigitated electrodes 270. In this embodiment the positive electrode digits are grouped into sets of four 262, and the negative electrode digits 270 are similarly grouped into sets of four 272. Each set of four positive electrode digits is connected to a terminal strip 220 through a first diode 240 allowing current to pass from the terminal strip to the digits, and a second diode 242 allowing current to pass in the opposite direction. One of skill in the art will recognize that this configuration comprises a form of a full bridge rectifier. Similarly the sets of negative electrode digits 272 are connect to the negative terminal strip 230 through a first diode 244 allowing current to pass from the digits to the terminal strip and a second diode 246 allowing current to flow in the opposite direction. This embodiment includes a plurality of positive terminal strips 220, 222, and a plurality of negative terminal strips 230, 232. The terminal strips can be in electrical communication with an external circuit.

The embodiments have been described, hereinabove. It will be apparent to those skilled in the art that the above methods and apparatuses may incorporate changes and modifications without departing from the general scope of this invention. It is intended to include all such modifications and alterations insofar as they come within the scope of the appended claims or the equivalents thereof.

I claim:

1. A device, comprising:
a central cylinder having a first end and a second end spaced apart from the first end and defining a longitudinal axis, the central cylinder being adapted to support one or more piezoelectric elements;
at least one piezoelectric fiber wound around the central cylinder according to a helical pattern;
at least one positive electrode in electrical communication with the at least one piezoelectric fiber, and adapted to impose a positive electric field on the piezoelectric fiber, the applied electric field causing a structural change in the at least one piezoelectric fiber;
at least one positive terminal strip in electrical communication with the at least one positive electrode;
at least one output diode electrically separating the at least one positive electrode from the at least one positive terminal strip, and permitting a current to flow from the positive electrode to the positive terminal strip;
at least one input diode electrically separating the at least one positive electrode from the at least one positive terminal strip, and permitting a current to flow from the terminal strip to the positive electrode;

at least one negative electrode in electrical communication with the at least one piezoelectric fiber, and adapted to impose a negative electric field on the piezoelectric fiber, the applied electric field causing a structural change in the at least one piezoelectric fiber;

at least one negative terminal strip in electrical communication with the at least one negative electrode;

at least one output diode electrically separating the at least one negative electrode from the at least one negative terminal strip, and permitting a current to flow from the negative electrode to the negative terminal strip;

at least one input diode electrically separating the at least one negative electrode from the at least one negative terminal strip, and permitting a current to flow from the terminal strip to the negative electrode; and a nonconductive layer disposed over the at least one piezoelectric fiber and the electrodes, the nonconductive layer electrically isolating the underlying elements from the surrounding environment.

2. The device of claim 1, wherein the central cylinder comprises spring steel.

3. The device of claim 1, wherein a longitudinal axis of the helix runs substantially parallel with the longitudinal axis of the central cylinder.

4. The device of claim 1, wherein the at least one piezoelectric fiber is bonded to the central cylinder with a bonding agent.

5. The device of claim 4, wherein the bonding agent is selected from the group consisting of epoxy resins, cyanoacrylate resins, acrylic resins, and any combination thereof.

6. The device of claim 1, wherein the at least one positive electrode, the at least one positive terminal strip, the at least one negative electrode, and the at least one negative terminal strip comprise one or more conductive materials independently selected from the group consisting of aluminum, gold, silver, copper, and platinum.

7. The device of claim 1, wherein the at least one positive electrode and the at least one negative electrode comprise at least one structure selected from the group consisting of wire, filament, ribbon, and coating.

8. The device of claim 7, wherein the coating structure is formed by painting a conductive material onto the piezoelectric fiber.

9. The device of claim 7, wherein the positive electrode and the negative electrode comprise interdigitated electrodes.

10. The device of claim 9, wherein the spacing between at least two digits of an electrode is from about 50 micrometers to about 3000 micrometers.

11. The device of claim 10, wherein the spacing between digits of an electrode is variable from one pair of digits to another.

12. The device of claim 7, wherein at least one electrode comprises a wire wrapped helically around piezoelectric fiber, wherein the longitudinal axis of the electrode helix is substantially parallel to the longitudinal axis of a linearly extending piezoelectric fiber.

13. The device of claim 12, wherein the combination of the piezoelectric fiber and the electrode helix are wrapped helically around the central body.

14. The device of claim 1, wherein the nonconductive layer comprise one or more materials selected from the group consisting of silicone, butyl rubber, styrene butadiene rubber, neoprene, and latex.

15. The device of claim 1, wherein the terminal strips of the device are in electrical communication with an electronic device, and the device functions to supply power to other components of the electronic device by converting mechanical energy into electrical energy.

16. The device of claim 15, wherein the electronic device comprises a remote keyless entry for an automobile, wherein the remote keyless entry does not include a battery.

17. The device of claim 16, wherein the remote keyless entry device comprises at least one button and the device is in mechanical communication with the button so that applying a force to the button results in imparting a radial compressive force to the device and causing the central body of device to take on a reversibly compressed conformation and produce an electrical potential.

18. The device of claim 17, wherein an electrical potential can also be generated when radial compressive force is removed and the central body relaxes to it original conformation.

19. The device of claim 1, wherein the piezoelectric fiber comprises one or more materials selected from the group consisting of polyvinylidene fluoride, lithium niobiate, barium titanate, barium strontium titanate, lead scandium titanate, and lead zirconate titanate.

20. A means for supplying power to a remote keyless entry device, comprising:

a piezoelectric transducing means;

at least two oppositely chargeable means for collecting electrical energy from the piezoelectric transducing means;

at least two oppositely chargeable current collecting means for receiving current from one or more conductive means having the same charge;

at least two oppositely directed rectifying means for rectifying current from the positively chargeable means to the positive current collecting means, the positive current collecting means being capable of electrically communicating with an external circuit comprising a remote keyless entry device; and at least two oppositely directed rectifying means for rectifying current from the negatively chargeable means to the negative current collecting means, the negative current collecting means being capable of electrically communicating with an external circuit comprising a remote keyless entry device.

* * * * *